(12) United States Patent
Eldridge et al.

(10) Patent No.: US 7,621,044 B2
(45) Date of Patent: Nov. 24, 2009

(54) METHOD OF MANUFACTURING A RESILIENT CONTACT

(75) Inventors: Benjamin N. Eldridge, Danville, CA (US); Gaetan L. Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 361 days.

(21) Appl. No.: 10/971,489

(22) Filed: Oct. 22, 2004

(65) Prior Publication Data

US 2006/0085976 A1   Apr. 27, 2006

(51) Int. Cl.
*H01R 43/20* (2006.01)
(52) U.S. Cl. .............................. 29/876; 29/825; 29/842; 29/843; 29/844; 29/874; 257/E21.503; 257/E21.511; 438/597; 438/660; 439/66; 439/74; 439/286
(58) Field of Classification Search .................... 29/876, 29/825, 842–844, 874; 257/E21.503, E21.511; 438/597, 660; 439/74, 66, 284, 286
See application file for complete search history.

(56) References Cited

U.S. PATENT DOCUMENTS

| | | | |
|---|---|---|---|
| 4,745,670 A | 5/1988 | Morris | |
| 5,230,787 A | 7/1993 | Cherian et al. | |
| 5,299,939 A * | 4/1994 | Walker et al. | 439/74 |
| 5,476,211 A | 12/1995 | Khandros | 228/180.5 |
| 5,772,451 A * | 6/1998 | Dozier et al. | 439/70 |
| 5,852,871 A | 12/1998 | Khandros | 29/843 |
| 5,974,662 A | 11/1999 | Eldridge et al. | 29/842 |
| 6,036,832 A | 3/2000 | Knol et al. | |
| 6,049,976 A | 4/2000 | Khandros | 29/843 |
| 6,110,823 A | 8/2000 | Eldridge et al. | |
| 6,482,013 B2 | 11/2002 | Eldridge et al. | 439/66 |
| 6,669,489 B1 | 12/2003 | Dozier, II et al. | 439/71 |
| 2002/0121274 A1 | 9/2002 | Borland et al. | |

FOREIGN PATENT DOCUMENTS

DE    19853445    5/2000

* cited by examiner

*Primary Examiner*—Thiem Phan
(74) *Attorney, Agent, or Firm*—N. Kenneth Burraston

(57) ABSTRACT

Resilient spring contact structures are manufactured by plating the contact structures on a reusable mandrel, as opposed to forming the contact structures on sacrificial layers that are later etched away. In one embodiment, the mandrel includes a form or mold area that is inserted through a plated through hole in a substrate. Plating is then performed to create the spring contact on the mold area of the mandrel as well as to attach the spring contact to the substrate. In a second embodiment, the mandrel includes a form that is initially plated to form the resilient contact structure and then attached to a region of a substrate without being inserted through the substrate. Attachment in the second embodiment can be achieved during the plating process used to form the spring contact, or by using a conductive adhesive or solder either before or after releasing the spring contact from the mandrel.

20 Claims, 6 Drawing Sheets

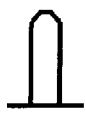
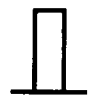
FIG. 2A          FIG. 2B          FIG. 2C          FIG. 2D
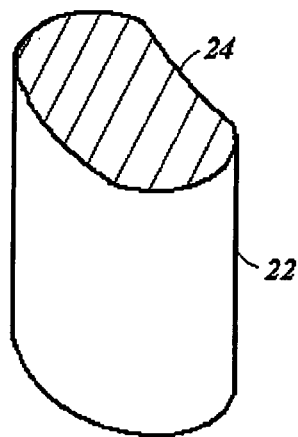
FIG. 3
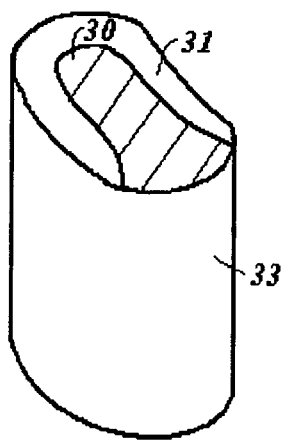
FIG. 4
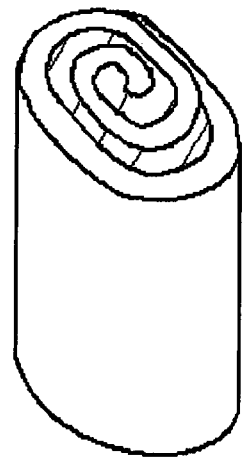
FIG. 5

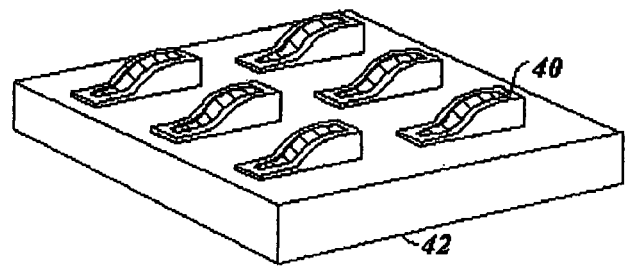
FIG. 8A

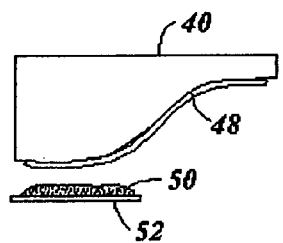
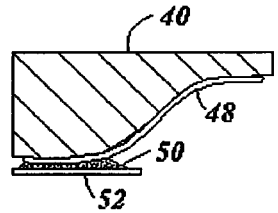
FIG. 8D
FIG. 8E
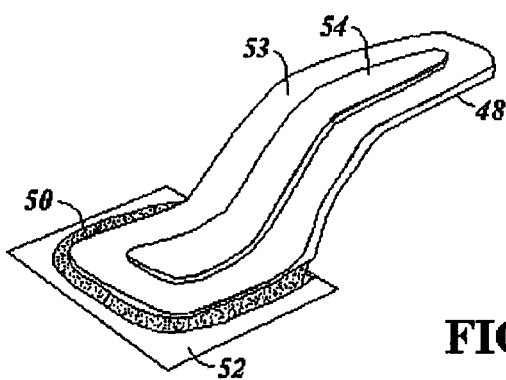
FIG. 8F

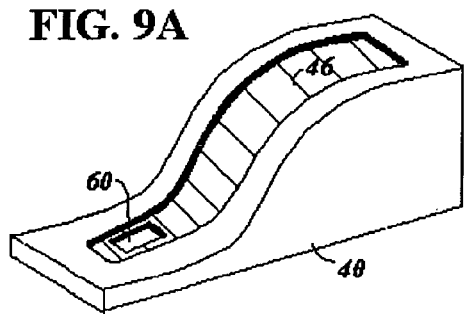
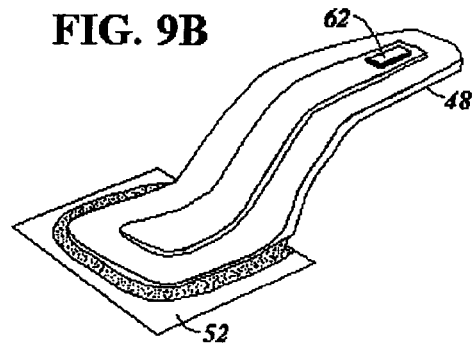
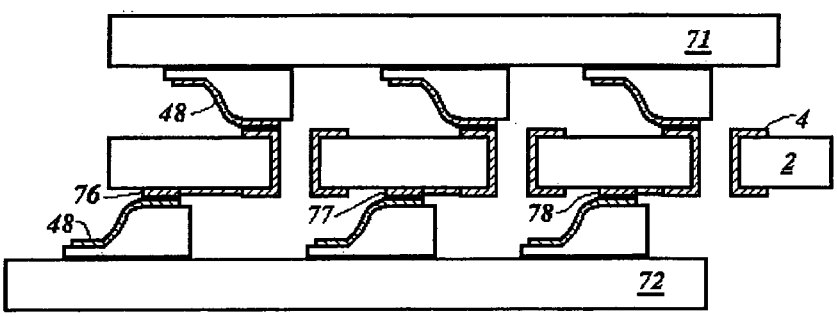
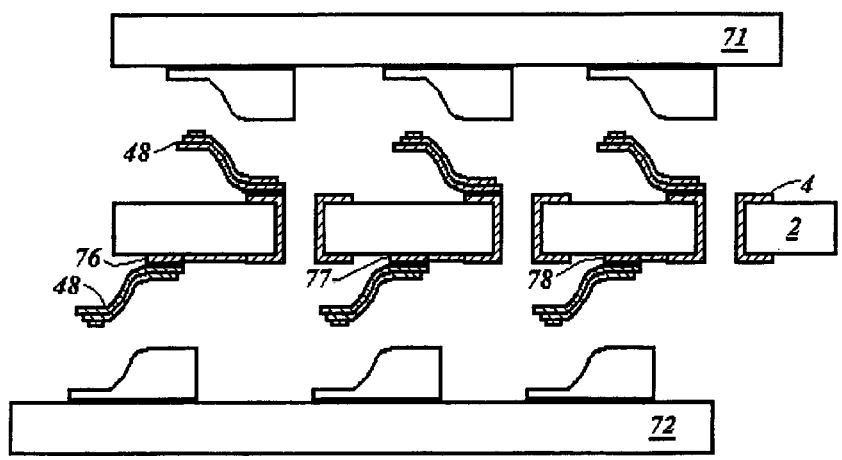

METHOD OF MANUFACTURING A RESILIENT CONTACT

BACKGROUND

1. Technical Field

The present invention relates to a resilient electrical contact element, or spring contact for making pressure contacts between electrical components. More particularly, the present invention relates to a structure used to form the spring contacts and a method of forming the spring contacts and attaching the contacts to a substrate for use in probing integrated circuits (ICs) on a wafer, or as contacts for wafer level packaging, socket contacts, or other resilient contact structure embodiments.

2. Related Art

Resilient contact elements, or spring contacts are manufactured in a variety of forms. One type of spring contacts used for probing ICs on a wafer is described in U.S. Pat. No. 5,476,211 entitled "Method of Manufacturing Electrical Contacts, Using a Sacrificial Member" and its counterpart divisional patents, U.S. Pat. No. 5,852,871, and U.S. Pat. No. 6,049,976, all by Khandros. These patents disclose methods for making resilient interconnection elements by mounting a flexible elongate core element (e.g., wire "stem" or "skeleton") to a terminal on an electronic component and coating the flexible core element with a "shell" of one or more materials to ensure a resilient nature. Exemplary materials for the core element include gold. Exemplary materials for the resilient coating include nickel and its alloys. The resulting spring contact element is used to make pressure connections between two or more electronic components including between a probe card and ICs on a wafer.

Connection of the spring contacts to a substrate to form a probe card, or other structure is described in U.S. Pat. No. 5,974,662, entitled "Method of Planarizing Tips of Probe Elements of a Probe Card Assembly" by Eldridge, Grube, Khandros and Mathieu. This patent describes a probe card assembly including resilient spring contact elements mounted to form a "space transformer." A space transformer is a multilayer interconnection substrate having terminals disposed at a first pitch, or spacing between terminals on one surface and having corresponding terminals disposed at a second pitch on an opposite surface. Space transformation is provided by routing lines in the layers of the substrate used to effect "pitch-spreading" from the first pitch to the second pitch. In use, the free ends (tips) of the elongate spring contact elements make pressure connections with corresponding terminals on an electronic component being probed or tested.

A more recent type of spring contact element is described in U.S. Pat. No. 6,482,013, entitled "Microelectronic Spring Contact Element and Electronic Component Having A Plurality Of Spring Contact Elements" by Eldridge, Grube, Khandros and Mathieu, incorporated herein by reference. This patent describes photo lithographic rather than mechanical techniques to fabricate resilient contact elements. As with the mechanically formed contact elements, the resilient contact elements formed using lithographic techniques include a resilient material, such as nickel and its alloys. To manufacture a probe card, or other substrate with resilient contacts using photolithographic techniques, in one embodiment the spring contacts are formed on the surface of a sacrificial substrate by a series of steps including plating or deposition of material, applying photoresist, masking using photolithographic techniques, and etching. The sacrificial substrate with spring contacts is then transferred and mounted on terminals of a space transformer. The sacrificial substrate is then removed.

In addition to being provided on a space transformer in a probe card, resilient spring contacts can also be used on an interposer of a probe card to flexibly interconnect multiple space transformer substrates. The interposer includes resilient contacts provided on both sides of a substrate.

Additionally, resilient contacts can be anchored to a pad or terminal on a number of other electronic components as described in U.S. Pat. No. 6,669,489, entitled "Interposer, socket and assembly for socketing an electronic component and method of making and using same." The resilient contacts serve to electrically attach to a pad or terminal and be secured on one end, while maintaining electrical contact and absorbing compressive forces applied to the free end. Electronic components on which the spring contacts may be applied are described to include: the space transformer and interposer substrates described above, semiconductor wafers and dies; production interconnect sockets; test sockets; sacrificial members, elements and substrates, semiconductor packages, including ceramic and plastic packages, chip carriers; and connectors. The resilient contact is particularly beneficial when a applied to silicon dies, because they eliminate the need for having a semiconductor package.

It is desirable to continue to provide new methods of fabricating interconnection elements suitable for fine-pitch electrical connections, particularly methods that are repeatable, consistent and inexpensive.

SUMMARY

In accordance with the present invention, resilient contact structures are described that can be manufactured by plating to form contact structures on a reusable mandrel, as opposed to contact structures formed on sacrificial layers that are later etched away and must be recreated.

In a first embodiment, a mandrel for creating the resilient contact structure includes a form that is inserted through a plated through hole in a substrate. The form has a surface providing a mold for the resilient contact, with surrounding areas of the mold being made of an isolating material to prevent metal from attaching during plating. To manufacture the resilient contact, the mandrel is inserted through a hole in the substrate, and plated using an electroplating or electroless plating process is performed to create the resilient contact structure on the mold area of the mandrel as well as on the surface of the substrate to attach the resilient contact to the substrate. The mandrel is then released leaving the resilient contact structure attached.

In a second embodiment, the mandrel for creating the resilient contact includes a molding area for forming a resilient contact structure, but unlike the first embodiment the mandrel is configured to form and attach the spring contact structure without being inserted through a substrate. The resilient contact structure in the second embodiment can be attached by contacting a substrate surface with the mandrel and performing plating to form the contact structure of the mandrel, as well as to attach the contact structure to a pad on the substrate surface. The resilient contact created on the mandrel in the second embodiment can likewise be formed on the mandrel and later attached to a structure on a substrate by a means such as soldering, welding or using a conductive adhesive material. The resilient contact in the second embodiment can further be formed on the mandrel and released, and then later attached to a substrate by means such as soldering welding, or using conductive adhesive. After attachment, in either the first or second embodiment the resilient contact is released from the mold and the mandrel can be reused.

For both the first and second embodiments, a number of mandrels can be attached together in an array so that plating can be used to form a number of resilient contacts concurrently. With such an array, the resilient contacts can be attached to conductive areas on a substrate in a gang fashion, and the mandrels later reused.

A number of shapes can be provided for molds on mandrels to form spring contacts. In one embodiment, the mold area is simply a sloped surface. In another embodiment, the mold area forms a tapered spiral. In a further embodiment, a depression is created in the surface of a slope to form a bump in the final spring created to provide a contact tip.

At least two types of materials can be used for the mandrel. In one embodiment, the mandrel is made of a ceramic or polymer with a molding surface metallized to provide the area for plating the resilient contact. In another embodiment, the mandrel is made of a metal and isolation is provided by selectively passivating a surface or by coating a surface with an isolating material like aluminum oxide.

BRIEF DESCRIPTION OF THE DRAWINGS

Further details of the present invention are explained with the help of the attached drawings in which:

FIGS. 2A-2D show alternative embodiments of tips of a mandrel to form various shaped resilient contact structures;

FIG. 3 is a perspective view illustrating a mandrel with a sloped tip, the mandrel formed with either a ceramic material with metal coating in the electroform area, or formed with a metal structure having an isolation material coating where plating material is not desired;

FIG. 4 is a perspective view of a mandrel having a sloped tip, with only a portion of the tip coated for plating a spring contact;

FIG. 5 is a perspective view illustrating a mandrel having a tapered spiral tip;

FIGS. 8A-8F are perspective views showing steps for an alternative second embodiment where resilient contact elements are plated on mandrels and then attached;

FIGS. 9A-9B illustrate the second embodiment with mandrels modified from those in FIGS. 8A-8F to form a contact tip in the resilient contact elements;

FIGS. 10A-10B illustrate arrays of mandrels connected together and used to attach spring contacts to both sides of a substrate with and without pitch spreading.

DETAILED DESCRIPTION

FIGS. 1A-1F shows manufacturing steps for a first embodiment for forming resilient contact elements by plating on mandrels that are inserted through holes in a substrate. Initially in FIG. 1A a substrate 2 is provided with openings plated with a conductive material and patterned to form plated through holes 4 through which the mandrels are to be inserted. The substrate can be formed from a variety of materials such as ceramic, aluminum, copper, titanium, tungsten, an organic material, or a semiconductor material such as silicon or gallium arsenide that can support ICs.

Figure 1A:
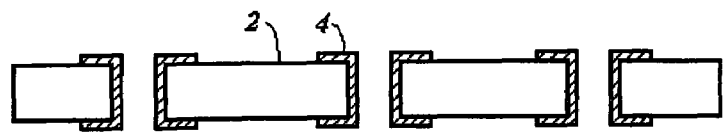
FIGS. 1A-1F are cross sectional views showing manufacturing steps for the first embodiment to form resilient contact elements by plating on mandrels inserted through plated through holes in a substrate.
Figure 1B:
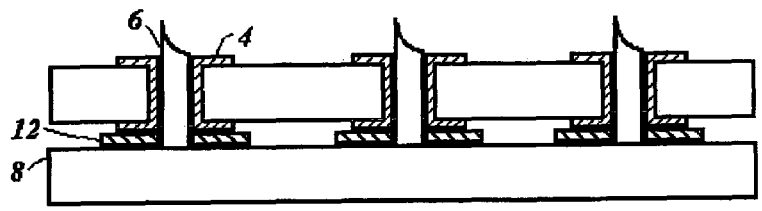

Next, as shown in FIG. 1B, multiple mandrels 6 are attached to a support structure 8 and inserted through the plated through holes 4. A seal material 12 is optionally provided on the support structure 8 around the mandrels 6 to prevent the flow of fluid used for electroplating or electro-less plating of the resilient contacts. Although multiple mandrels are preferable, it is contemplated that individual mandrels not connected in an array can be used either together or one at a time.

Figure 1C:
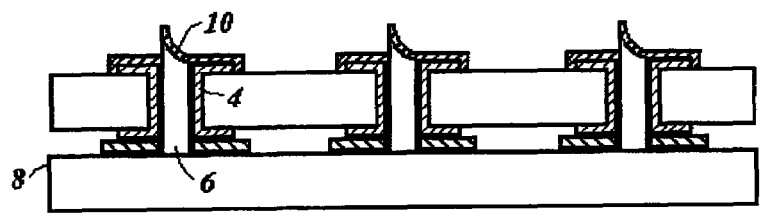

Plating can then be performed as shown in FIG. 1C to form resilient contact structures 10 on the tips of mandrels 6 as well as on other exposed portions of the plated through holes 4 to attach the resilient contact structures 10. The resilient contact can be an electroform spring formed by plating a single layer of a resilient metal material such as a nickel based metal and its alloys. Alternatively, the resilient contact can be a multi-layer spring formed by plating a first layer of a conductive material selected for its superior electrical characteristics such as electrical conductivity, low contact resistance, solderability, and resistance to corrosion, followed by plating a layer of resilient material such as nickel and its alloys, followed then by another layer of material having superior electrical characteristics. Although three plating layers are described, one or more layers can be plated depending on the desired structure for the resilient contact. With the process illustrated in FIG. 1C, the plating material forming the resilient contacts 10 contacts the plated through holes 4 serving to attach the resilient contacts 10 to the substrate.

A number of materials may be used for the one or more layers of the spring contact structures. Materials include but are not limited to: nickel, and its alloys; copper, aluminum, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the palladium group and their alloys; tungsten, molybdenum and other refractory metals and their alloys. In cases where a solder-like finish is desired, tin, lead, bismuth, indium and their alloys can also be used. Nickel-cobalt is an example of a good material for brazing.

Plating can be performed by either electroplating, electro-less plating, CVD, sputtering, or a similar process. Electro-less plating is typically performed using plating materials made from nickel and its alloys such as nickel phosphorous, or nickel boron. Other materials, including gold can also be applied by an electroless process.

Figure 1D:
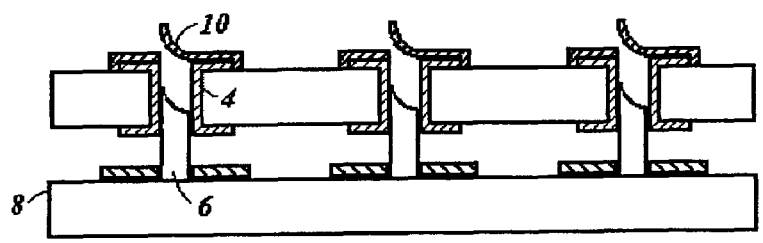

Once plated, the support structure 8 can be moved to pull mandrels 6 back through the plated through holes 4 so that the mandrels 6 are released from the resilient contact structures 10 as illustrated in FIG. 1D. Releasing can be performed using thermal shock, or by simply applying a force. The rinse water in which the mandrels 6 and resilient contact structures 10 are dipped after plating may provide sufficient thermal shock to separate the mandrels 6 from the resilient contacts 10 allowing the different materials of the mandrels 6 and resilient contact structures 10 to expand at different rates.

Figure 1E:
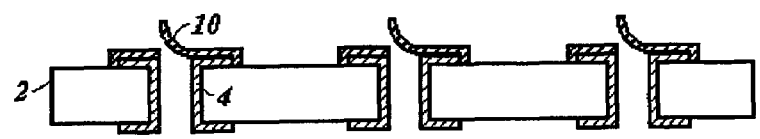

FIG. 1E shows the resulting resilient contact structures 10 as attached to the plated through holes 4 of a substrate 2 once the mandrels 6 have been removed. The resulting structure of FIG. 1E can then be attached to a separate substrate to electrically connect to the plated through holes, such as on a space transformer, an interposer, or a wiring substrate. Likewise, the structure can be connected to semiconductor wafers, sockets, or semiconductor packages.

Figure 1F:
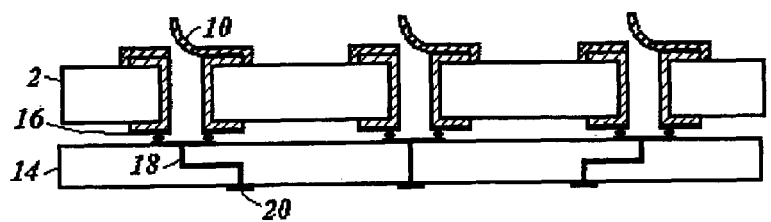

Connection of the structure of FIG. 1E to a wiring substrate 14 is illustrated in FIG. 1F. Attachment of the substrate 2 to the space transformer substrate 14 can be provided by heating to flow solder bumps 16 provided over traces 18 on the space transformer substrate 14, so that the solder bumps 16 attach to the plated through holes 4 of the substrate 2. Similarly, attachment can be performed using brazing or a conductive adhesive. The wiring substrate 14 includes traces 18 connecting the plated through holes on one side to pads 20 on a different side having a different spacing between pads, and may be coarser or finer pitch. The resulting structure can form part of a probe card with probes 10 used to contact ICs on a wafer for testing, or other applications.

FIGS. 2A-2D illustrate that a number of alternative mandrel tips can be used to create various shaped resilient contact structures. FIG. 2A shows a mandrel tip with a sloped surface, as illustrated in FIGS. 1A-1F. FIG. 2B shows a half dome shaped mandrel tip to enable forming a conductive bump as a resilient contact structure. FIG. 2C shows a square shaped tip. FIG. 2D shows a tapered spiral tip for forming a similar tapered spiral spring surface. FIGS. 2A-2D, however, illustrate only of a few possible mandrel tips, with many other tip shapes being possible.

FIG. 3 shows a perspective view of a mandrel with a sloped tip, as in FIGS. 1A-1F and 2A, as configured so that plating occurs over the sloped surface of the mandrel tip. In one embodiment for FIG. 3, the mandrel is made of a dielectric material 22, such as ceramic or glass that will not electroplate, and is coated with a metal 24 in a region where plating is desirable. In another embodiment, the mandrel is formed with a metallic structure with the surface 22 coated with an isolation material or passivated where electroplating is not desired, leaving the metallized region 24 exposed for plating.

An isolation material used to coat a metal mandrel can be any isolating material that is sufficiently thick to prevent plating. Examples of isolation materials that can be used to coat a metal mandrel include stainless steel or tin oxide (particularly coating a titanium mandrel), a photo-resist material, or an electrophonetic spray coating. A preferred embodiment of a metallic coating enabling electroplating is aluminum. An example of a metallic material mandrel is titanium or stainless steel with the isolation coating being a thin oxide formed on either metal. Another metallic material for either forming a metal mandrel or providing a metal plating region is tungsten carbide. Although several examples of materials for mandrels are described, these are not intended to be limiting.

FIG. 4 illustrates a mandrel having a sloped tip, with only a portion of the tip 30 providing a plating surface. FIG. 4 illustrates that the sloped tip, or other tips can be partially passivated or coated with a material in region 31 that does not allow plating to create desired spring shapes. In a preferred embodiment, the tip is passivated in region 31, while the shaft 33 of the mandrel is coated with an isolating material that is sufficiently thick to prevent plating. With the mandrel being titanium or stainless steel, passivation is a thin oxide that can be plated onto even though it is an insulating, or semi-insulating layer. FIG. 5 illustrates a mandrel having a tapered spiral tip, illustrating how the mandrel can be passivated or coated to form a tapered coil ribbon spring. Although a metal mandrel with an isolation or passivation coating is described, a dielectric mandrel with a metal-coated surface can similarly be used to form the mandrels shown in FIGS. 4-5.

In a second embodiment for forming resilient contact elements, resilient contacts are plated on mandrels that can be used to attach and release resilient contacts to a substrate without inserting the mandrels through the substrate, unlike the embodiment of FIGS. 1A-1F. Two different manufacturing methods for this second embodiment are described, a first illustrated by FIGS. 7A-7D, and a second illustrated by FIGS. 8A-8F.

Figure 6:
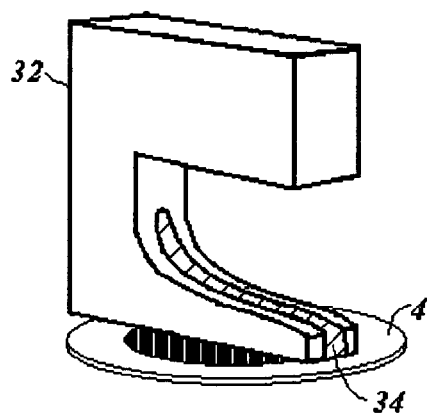
FIG. 6 is a perspective view of the resilient contact structure formed according to the steps shown in FIGS. 7A-7D.

For reference, FIG. 6 shows a perspective view of a mandrel 32 with a resilient contact element 36 formed thereon according to the steps of FIGS. 7A-7D, with the mandrel 32 and contact structure 36 provided over a plated through hole 4 for attachment. The mandrel 32 can be a dielectric material with a metal coating exposed and connected for electroplating, or likewise the mandrel can be a metal material with a passivated surface or isolation coating, as described previously. Although the mandrel 32 is shown with a particular geometric shape for forming spring contacts, other shapes can be provided.

Figure 7A:
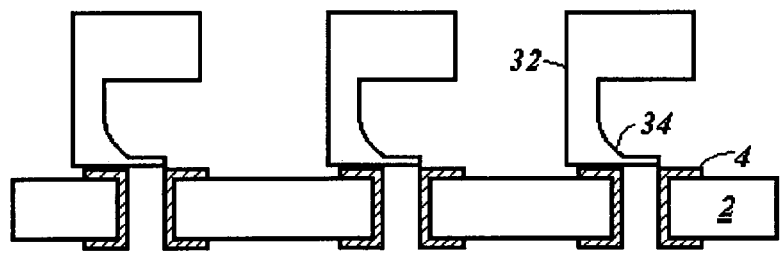
FIGS. 7A-7D are cross sectional views showing manufacturing steps for a second embodiment of resilient contact elements formed by plating on mandrels and attaching the contact elements without inserting the mandrels through a substrate.
Figure 7B:
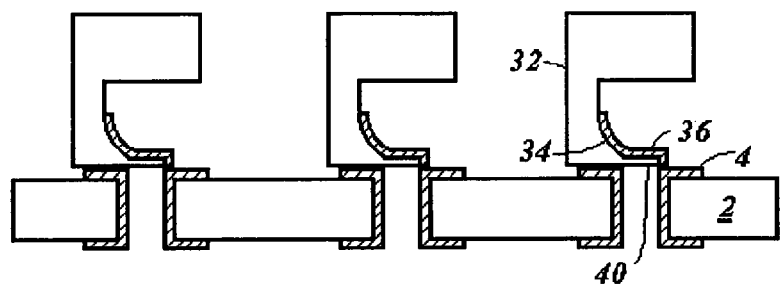

FIG. 7A illustrates a first step for manufacturing a spring contact using mandrels 32 that are shaped like a foot, the mandrels 32 having a first top surface 34 providing a form for plating a resilient contact structure 36 (shown in FIG. 7B). Although shown separate, the mandrels 32 can be held together with a support structure. Similarly, although an array of mandrels is shown in FIG. 7A, individual mandrels may likewise be used to separately attach spring contacts 36. To enable attachment a second bottom surface 40 of the mandrels 32 are rested on the plated through holes 4 of the substrate 2.

To form the spring contacts 36 as well as to attach the spring contacts, as shown in FIG. 7B, plating in performed. Plating forms the spring contacts 36 in the region 34 of the mandrels 32 as well as on the metallized regions of the plated through holes 4 to effectively attach the resilient contact 36 to the metallized region. As with the description regarding FIGS. 1A-1F, the resilient contact 36 is formed by plating the metal onto a portion 34 of the mandrel 32 with a metallized surface, while the remaining isolation surfaces remain uncoated. Although shown attached to plated through holes 4, it is understood that attachment could be made to another metal surface such as a trace on the substrate 2. With traces, connections to other substrates can be made by wire bonding to the traces. Alternatively, the traces can link a resilient contact to a plated through hole for connection to another substrate.

Figure 7C:
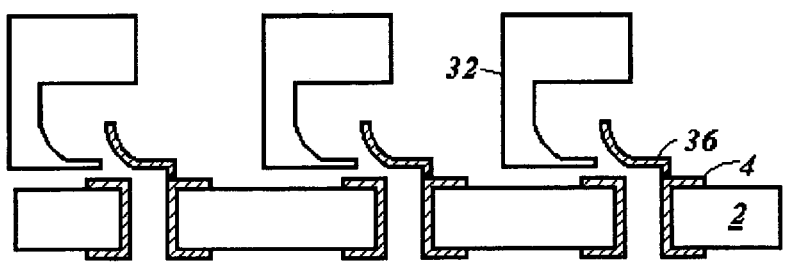
Figure 7D:
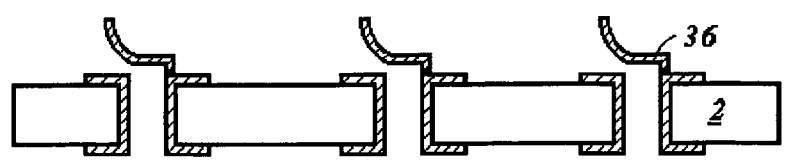

FIG. 7C illustrates releasing of the mandrels 32 from the resilient contact elements 36 after the resilient contact elements 36 are attached to the plated through holes 4. Release can be accomplished by thermal shock, or other means to separate the different material types of the mandrel and resilient contact as described with respect to FIGS. 1A-1F. As shown, after release the mandrels 36 are removed laterally relative to the plane of the substrate, and the mandrels 36 can be reused for subsequent formation of additional resilient contacts. The completed substrate 2 with attached resilient contact elements 36 is shown in FIG. 7D. The completed structure can be attached to a wiring substrate to provide part of a probe card for wafer testing, similar to that shown in FIG. 1F.

FIGS. 8A-8F show an alternative manufacturing method to FIGS. 7A-7D using mandrels for forming resilient spring contacts that do not need to be inserted through a substrate as in FIGS. 1A-1F. As opposed to the method shown in FIGS. 7A-7D where the mandrels contact the substrate and are released by moving laterally relative to the substrate, in FIGS.

8A-8F the mandrel does not contact the substrate during attachment, and release is accomplished by moving the mandrel tangentially (or vertically) away from the plane of the substrate surface.

Figure 8B:
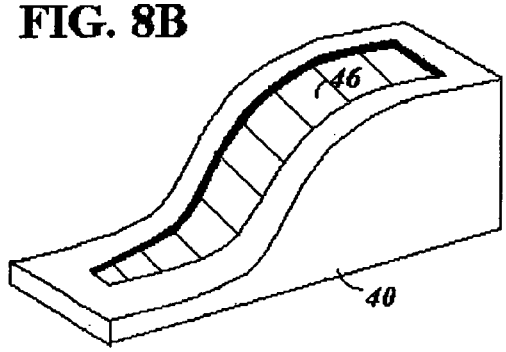

FIG. 8A shows an array of the mandrels 40 attached to a support structure 42 on which the resilient spring contacts are to be formed. FIG. 8B shows a blown up view of one of the mandrels 40 of FIG. 8A. As shown, the mandrel 40 includes a surface with a plating area 46. If electroplating is desired, the mandrel 40 can be formed from a dielectric material with a metal-coated region 46 for electroplating, or the mandrel 40 can be a metal material with a passivation region or isolation coating where plating is not desired. With a metal mandrel, the dielectric coating can be a photo-resist, an electrophonetic spray coating, or other material as described previously. Although the area for plating 46 shown is sloped with only a portion of the slope used for plating, other configurations can be used, as shown previously. The plating area 46 is recessed to enable control of the thickness of the spring contact, although recessing the plating area 46 is not required.

Figure 8C:
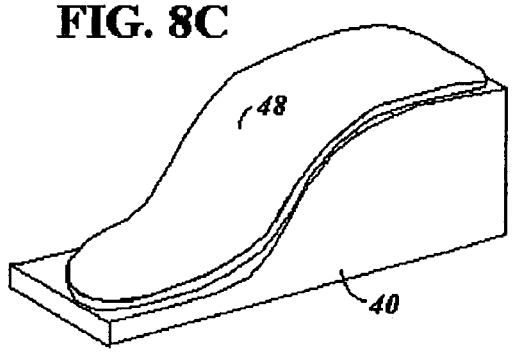

FIG. 8C illustrates plating of the mandrel 40. As shown, plating material forming the resilient contact 48 covers the area 46 of the mandrel 40 having an exposed metal region. Further some overflow of the plating material forming the resilient contact 48 is shown extending beyond the recessed portion 46. Such overflow is not necessary, but is shown in FIG. 8C for illustration.

Unlike the embodiment of FIGS. 7A-7D, plating is performed separate from a process of attachment of the resilient contact 48 to a substrate as shown in FIGS. 8D and 8E. FIG. 8D shows attachment of the spring contact to a surface 52 using an attachment material 50 such as in soldering, brazing, using a conductive adhesive, or other means known in the art. Soldering can be performed in at least one of three ways, including: (1) placing the end of a contact element to be soldered in contact with a screen printed paste over the substrate and reflowing the assembly in an oven; (2) applying a screen paste as in the first way but reflowing by passing a current between the substrate metal and metal contact element on the mandrel; and (3) by welding the resilient contact directly to the contact point by spot welding. With attachment using a laser, in one embodiment, a material 50 connecting the spring contact 48 is a powdered metal that can be sintered using a laser. With material 50 being a solder or brazing material, it can be heated for attachment. As a further alternative, the material 50 can be an adhesive material such as a conductive epoxy, or a conductive filled epoxy with the filler material adding attachment strength if needed.

Unlike attachment in FIGS. 7A-7D, with the mandrel 40 of FIGS. 8A-8E, the mandrel 40 does not contact the substrate, and the mandrel 40 can be separated after attachment by moving it tangentially or vertically away from the plane of the surface where the resilient contact is attached. Once, the resilient contact 48 is attached, the mandrel 40 is released leaving the resilient contact 48 bonded to the substrate, as illustrated FIG. 8F. Release can be performed as described previously by thermal shock, or other procedure. As shown, the resilient contact 48 includes an extended contact region 54 formed by the depression 46 of the mandrel. Overflow material 53 flowing out of the depression 46 during plating is shown, although plating can be used to form region 54 without the overflow material 53. The resilient contact 48 is shown bonded by material 50 to the substrate 52.

FIGS. 9A-9B illustrate mandrels modified from those in FIGS. 8A-8F to form a contact tip feature 62 in the resilient contact elements. The contact tip 62 shown in FIG. 9B is formed in the depression 60 in the recessed plated region 46 of the mandrel 40. The contact tip 62 is shown as a rectangular structure, although the depression could be round, square, pyramidal or other shape as desired. The contact tip minimizes the contact area, preventing contact with neighboring pads, as well as minimizing the area of a pad where damage due to contact may occur.

FIGS. 10A-10B illustrate arrays of the mandrels 40 as shown in FIGS. 9A-9B used to form and attach spring contacts 48 to a substrate 2. A number of the mandrels 48 are formed as part of a fixtures 71 and 72 enabling multiple spring contacts to be formed together as well as attached together. The mandrels are shown with spring contacts 48 plated and attached in FIG. 10A. The spring contacts 48 are then shown released from the mandrels in FIG. 10B.

FIGS. 10A and 10B illustrate that spring contacts 48 can be attached to both upper and lower surfaces of a substrate 2, using separate arrays of mandrels 71 and 72. The substrate 2 includes plated through holes 4, similar to that of FIGS. 1A-1F described previously. Although plated through holes 4 are shown, it is understood that the resilient contacts can be connected to metal regions on the substrate 2 not connected to plated through holes. Connection to pads that are also connected to the plated through holes 4 is illustrated by attachment using mandrels 72, where the resilient contacts 48 are attached to pads 76-78 connected by traces on the substrate 2 to the plated through holes 4. The pads 76-78 are connected by different length traces to the plated through holes 4 to illustrate that pitch spreading can be performed to connect the spring contacts with differing center to center spacing across the surface of the substrate 2, as well as between the different mandrels 71 and 72.

Figure 11A:
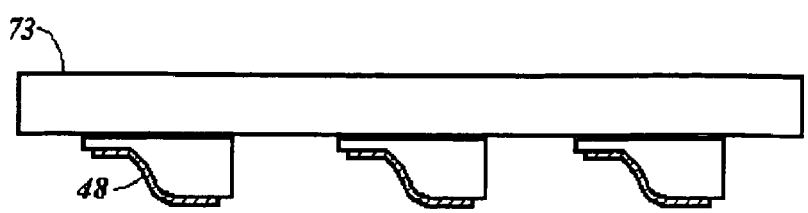
FIGS. 11A-11B illustrate forming spring contacts on mandrels and then releasing the spring contacts before attachment.
Figure 11B:
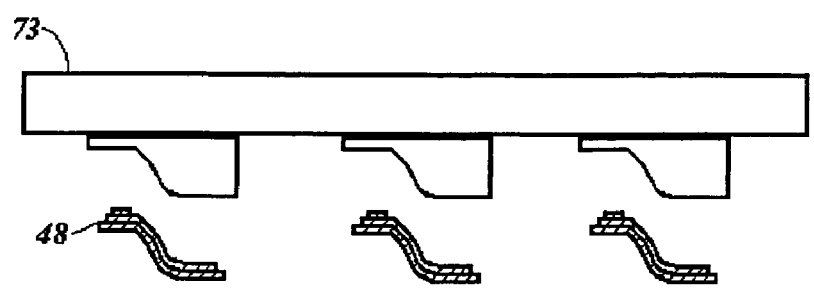

FIGS. 11A-11B illustrate forming spring contacts on mandrels and then releasing the spring contacts before attachment. FIG. 11A illustrates formation of the spring contacts 48 on mandrels configured in an array 73. FIG. 11B then illustrates releasing the formed individual springs using a process such as thermal shock, described earlier. The spring contacts can then be stored as a "bag of springs." The springs from the bag of springs can then re-assembled by attachment to a substrate using soldering, brazing, conductive adhesive, or other procedure known in the art. Although the spring contacts 48 are shown formed on a mandrel as described with respect to FIGS. 9A-9B, spring contacts can be formed and released from other mandrel configurations.

The spring contacts formed can be attached to a number of different electronic components, either prior to release of the spring contact from a mandrel or after the spring contact has been released from the mandrel. Electronic components on which the spring contacts described herein may be used include, but are not limited to: a substrate such a space transformer, interposer, or wiring substrate; semiconductor wafers and dies; production interconnect sockets; test sockets; sacrificial members; elements and substrates; semiconductor packages including ceramic and plastic packages; chip carriers; and connectors.

Although the present invention has been described above with particularity, this was merely to teach one of ordinary skill in the art how to make and use the invention. Many additional modifications will fall within the scope of the invention, as that scope is defined by the following claims.

What is claimed is:

1. A method for manufacturing a resilient contact, said method comprising:

forming a resilient contact by depositing a material onto a surface of a mandrel, the resilient contact having a body shape defined at least in part by the surface of the mandrel;

attaching the resilient contact to a substrate;
releasing the mandrel after the resilient contact is attached to the substrate and
reusing the mandrel to form a second resilient contact.

2. The method of claim 1, wherein:
forming a resilient contact on the mandrel comprises forming a plurality of resilient contacts on a plurality of mandrels, the plurality of mandrels attached to a common substrate, each resilient contact having a shape defined at least in part by its corresponding mandrel;
attaching the resilient contact to a substrate comprises simultaneously attaching the plurality of contacts to the substrate; and
releasing the mandrel comprises leaving the plurality of resilient contacts attached to the substrate.

3. The method of claim 2, wherein the plurality of resilient contacts comprises discrete resilient contacts.

4. The method of claim 2, wherein the forming a plurality of resilient contacts on a plurality of mandrels comprises forming the plurality of resilient contacts simultaneously.

5. The method of claim 1, wherein forming the resilient contact comprises plating the resilient contact.

6. The method of claim 5 wherein the plating is performed by electroplating.

7. The method of claim 6 wherein the plating is performed by electroless plating.

8. The method of claim 5, wherein the plating the resilient contact comprises:
plating a first material; and
plating a second material,
wherein the first material has a higher electrical conductivity than the second material, and the second material has a greater resiliency than the first material.

9. The method of claim 8, wherein the first material is selected from the group consisting of: copper, aluminum, cobalt, gold, silver, tungsten and combinations and alloys thereof.

10. The method of claim 8, wherein the second material is selected from the group consisting of: nickel, iron, tungsten and combinations and alloys thereof.

11. The method of claim 1, wherein the releasing is performed by applying a thermal shock to the mandrel and the resilient contact.

12. The method of claim 11, wherein the applying a thermal shock to the mandrel and the resilient contact comprises rinsing the mandrel and the resilient contact with a solution.

13. The method of claim 1, wherein the attaching the resilient contact to a substrate comprises positioning the mandrel proximate to the substrate to place the resilient contact in contact with a conductive structure on the substrate.

14. The method of claim 1, further comprising:
providing the mandrel with conductive portions and non-conductive portions, wherein the shape of the resilient contact is defined by a conductive portion of the mandrel.

15. The method of claim 1, further comprising forming a contact tip feature on the resilient contact.

16. The method of claim 1, wherein the attaching the resilient contact to the substrate is performed using any of soldering, welding, brazing, or combinations thereof.

17. The method of claim 1, wherein the forming a resilient contact on a mandrel comprises plating the material onto the surface of the mandrel.

18. A method for manufacturing a resilient contact, said method comprising:
forming a resilient contact on a mandrel, the resilient contact having a body shape defined at least in part by the mandrel;
attaching the resilient contact to a substrate; and
releasing the mandrel after the resilient contact is attached to the substrate,
wherein forming the resilient contact comprises plating the resilient contact,
wherein the plating the resilient contact comprises:
plating a first material; and
plating a second material,
wherein the first material has a higher electrical conductivity than the second material, and
the second material has a greater resiliency than the first material, and
wherein the first material is plated as a first layer onto the mandrel, and the second material is plated as a second layer onto the first material.

19. The method of claim 18, wherein, after releasing the resilient contact, the mandrel is reused to form another resilient contact.

20. The method of claim 18, further comprising simultaneously forming a plurality of resilient contacts on a plurality of mandrels.

* * * * *